US009754524B2

(12) United States Patent
Shirasaki

(10) Patent No.: US 9,754,524 B2
(45) Date of Patent: Sep. 5, 2017

(54) DISPLAY DRIVER

(71) Applicant: LAPIS Semiconductor Co., Ltd., Yokohama (JP)

(72) Inventor: Hijiri Shirasaki, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 110 days.

(21) Appl. No.: 14/835,811

(22) Filed: Aug. 26, 2015

(65) Prior Publication Data
US 2016/0063957 A1 Mar. 3, 2016

(30) Foreign Application Priority Data
Aug. 26, 2014 (JP) .................................. 2014-171670

(51) Int. Cl.
*G09G 3/20* (2006.01)
*G09G 5/18* (2006.01)
*G11C 19/28* (2006.01)

(52) U.S. Cl.
CPC .............. *G09G 3/20* (2013.01); *G09G 3/2096* (2013.01); *G09G 5/18* (2013.01); *G11C 19/28* (2013.01); *G09G 2310/027* (2013.01); *G09G 2310/0286* (2013.01); *G09G 2310/08* (2013.01); *G09G 2320/0233* (2013.01); *G09G 2330/025* (2013.01)

(58) Field of Classification Search
CPC ..... G09G 2310/027; G09G 2310/0286; G09G 2310/08; G09G 2320/0233; G09G 2330/025; G09G 3/20; G09G 3/2096; G09G 5/18
See application file for complete search history.

(56) References Cited

U.S. PATENT DOCUMENTS

| 8,081,151 B2* | 12/2011 | Kishimoto | ............... G09G 3/20 345/100 |
| 9,542,902 B2* | 1/2017 | Ishii | ...................... G09G 3/3696 |
| 2004/0189579 A1* | 9/2004 | Shimizu | ............... G09G 3/3688 345/98 |
| 2009/0195272 A1* | 8/2009 | Okuzono | ................. G09G 3/20 327/141 |

FOREIGN PATENT DOCUMENTS

JP 2004-301946 A 10/2004

* cited by examiner

*Primary Examiner* — Latanya Bibbins
(74) *Attorney, Agent, or Firm* — Rabin & Berdo, P.C.

(57) ABSTRACT

A display driver is provided which can prevent concentration of currents flowing into a display device and display a high-quality image without uneven luminance. A plurality of delayed clock signals used to apply a plurality of pixel driving voltages to data lines of the display device at respective different timings are generated by a DLL circuit including a variable delay circuit group constituted by variable delay circuits are connected in series, and a phase comparator that detects a phase difference of a delayed clock signal with respect to a reference clock signal and adjusts a delay amount of each of the variable delay circuits so that the phase difference converges to zero.

8 Claims, 13 Drawing Sheets

FIG. 6A

L SHIFT MODE
(3a: V SHIFT MODE)

$CL_1 \rightarrow L_1$
$CL_2 \rightarrow L_2$
$CL_3 \rightarrow L_3$
$CL_4 \rightarrow L_4$
......
$CL_{(t-2)} \rightarrow L_{(t-2)}$
$CL_{(t-1)} \rightarrow L_{(t-1)}$
$CL_t \rightarrow L_t$

FIG. 6B

R SHIFT MODE
(3b: V SHIFT MODE)

$CL_t \rightarrow L_1$
$CL_{(t-1)} \rightarrow L_2$
$CL_{(t-2)} \rightarrow L_3$
$CL_{(t-3)} \rightarrow L_4$
......
$CL_3 \rightarrow L_{(t-2)}$
$CL_2 \rightarrow L_{(t-1)}$
$CL_1 \rightarrow L_t$

DISPLAY DRIVER

BACKGROUND OF THE INVENTION

1. Field of the Invention

The present invention relates to a display driver for driving the display device according to a video signal.

2. Description of the Related Art

A liquid crystal display panel, an example of a display device, includes a plurality of gate lines extending in a horizontal direction of a two-dimensional screen and a plurality of source lines extending in a vertical direction of the two-dimensional screen. The gate lines and the source lines are arranged to intersect each other. A display cell taking charge of a pixel is formed at the intersection between each gate line and each source line. The liquid crystal display panel includes a source driver for applying gradation display voltages corresponding to the luminance levels of pixels expressed by an input video signal to the respective source lines, and a gate driver for applying a scan signal to the gate lines. As a source driver like this, one configured to individually take in a plurality of pieces of display data for a horizontal synchronizing period into a plurality of latches and apply the gradation display voltages corresponding to the pieces of display data taken into the respective latches to the source lines has been proposed (for example, see Japanese Patent Application Laid-Open No. 2004-301946). Such a source driver shifts the take-in timing of the display data by each of the foregoing latches by using delay circuits using element delays of inverter elements, whereby concentration of currents flowing into the source lines is prevented to prevent noise occurring in such a state.

With the delay circuits using the element delays of the inverter elements described above, the delay mounts vary due to manufacturing variations, ambient temperature, etc. The timing at which the gradation display voltages are applied to the display cells via the source lines therefore may fail to coincide with the timing at which the scan signal is applied to the display cells via the gate lines, possibly producing uneven luminance within the display screen.

SUMMARY OF THE INVENTION

An object of the present invention is to provide a display driver which can prevent concentration of currents flowing into the display device and display a high-quality image without uneven luminance.

A display driver according to the present invention is a display driver which drives a display device by applying K (K is an integer greater than or equal to 2) pixel driving voltages corresponding to pixel-by-pixel luminance levels indicated by an image data signal to K data lines of the display device, respectively, the display driver including: a delayed clock generation part configured to generate first to t-th (t is an integer less than or equal to K and greater than or equal to 2) delayed clock signals having phases different from each other and being synchronized with a reference clock signal; an output enable signal generation part configured to generate first to K-th output enable signals on the basis of the first to t-th delayed clock signals; and an output part configured to apply the K pixel driving voltages to the K data lines at respective different timings on the basis of the first to K-th output enable signals, wherein: the delayed clock generation part includes a phase comparator and a variable delay circuit group constituted by first to (t+1)-th variable delay circuits each having a basic delay time which is one (t+1)-th of a period of the reference clock signal are connected in series with each other; the reference clock signal is supplied to the first variable delay circuit; outputs of the first to t-th variable delay circuits in the variable delay circuit group serve as the first to t-th delayed clock signals respectively; and the phase comparator adjusts a delay time of each of the first to t-th variable delay circuits in the variable delay circuit group on the basis of a phase difference between a signal output from the (t+1)-th variable delay circuit and the reference clock signal.

A display driver according to the present invention is a display driver including: a first driver for applying first to K-th (K is n/2 and n is an integer greater than or equal to 2) pixel driving voltages among the first to an n-th pixel driving voltages corresponding to pixel-by-pixel luminance levels indicated by an image data signal to first to K-th data lines of the display device, respectively; and a second driver for applying a (K+1)-th to the n-th pixel driving voltages among the first to n-th pixel driving voltages to (K+1)-th to n-th data lines of the display device, respectively, wherein: the first and second drivers each include a delayed clock generation part configured to generate first to t-th (t is an integer less than or equal to K and greater than or equal to 2) delayed clock signals having phases different from each other and being synchronized with a reference clock signal; an output enable signal generation part configured to generate first to K-th output enable signals on the basis of the first to t-th delayed clock signals; and an output part configured to apply the K pixel driving voltages to the K data lines at respective different timings on the basis of the first to K-th output enable signals, wherein: the delayed clock generation part includes a phase comparator and a variable delay circuit group constituted by first to (t+1)-th variable delay circuits each having a basic delay time which is one (t+1)-th of a period of the reference clock signal are connected in series with each other; the reference clock signal is supplied to the first variable delay circuit; outputs of the first to t-th variable delay circuits in the variable delay circuit group serve as the first to t-th delayed clock signals respectively; and the phase comparator adjusts a delay time of each of the first to t-th variable delay circuits in the variable delay circuit group on the basis of a phase difference between a signal output from the (t+1)-th variable delay circuit and the reference clock signal.

According to the present invention, the timing at which to apply the plurality of pixel driving voltages to the respective data lines of the display device are forcedly made different. This prevents currents flowing into the data lines from concentrating at the same point in time.

Moreover, in the present invention, the plurality of delayed clock signals used to apply the plurality of pixel driving voltages at respective different timings are generated by a DLL circuit that includes the variable delay circuit group in which the variable delay circuits are connected in series and the phase comparator. Such a DLL circuit adjusts the delay amount of each of the variable delay circuits so that a phase difference of each delayed clock signal with respect to the reference clock signal converges to zero. As a result, the timing at which to apply the pixel driving voltages to the data lines can be matched with timing at which a horizontal scan pulse is applied to display cells via a horizontal scan line, regardless of manufacturing variations or ambient temperature. A high-quality image without uneven luminance can thus be displayed.

Consequently, according to the present invention, noise occurring from the concentration of currents flowing into the display device can be suppressed, and a high-quality image without uneven luminance can be displayed regardless of manufacturing variations or ambient temperature.

BRIEF DESCRIPTION OF THE DRAWINGS

FIG. 2 is a block diagram showing an example of an internal configuration of a driver IC 3a;

FIGS. 6A and 6B are diagrams showing an operation of a clock selector 1342;

DETAILED DESCRIPTION OF THE EMBODIMENTS

An embodiment of the present invention will be described in detail below with reference to the drawings.

Figure 1:
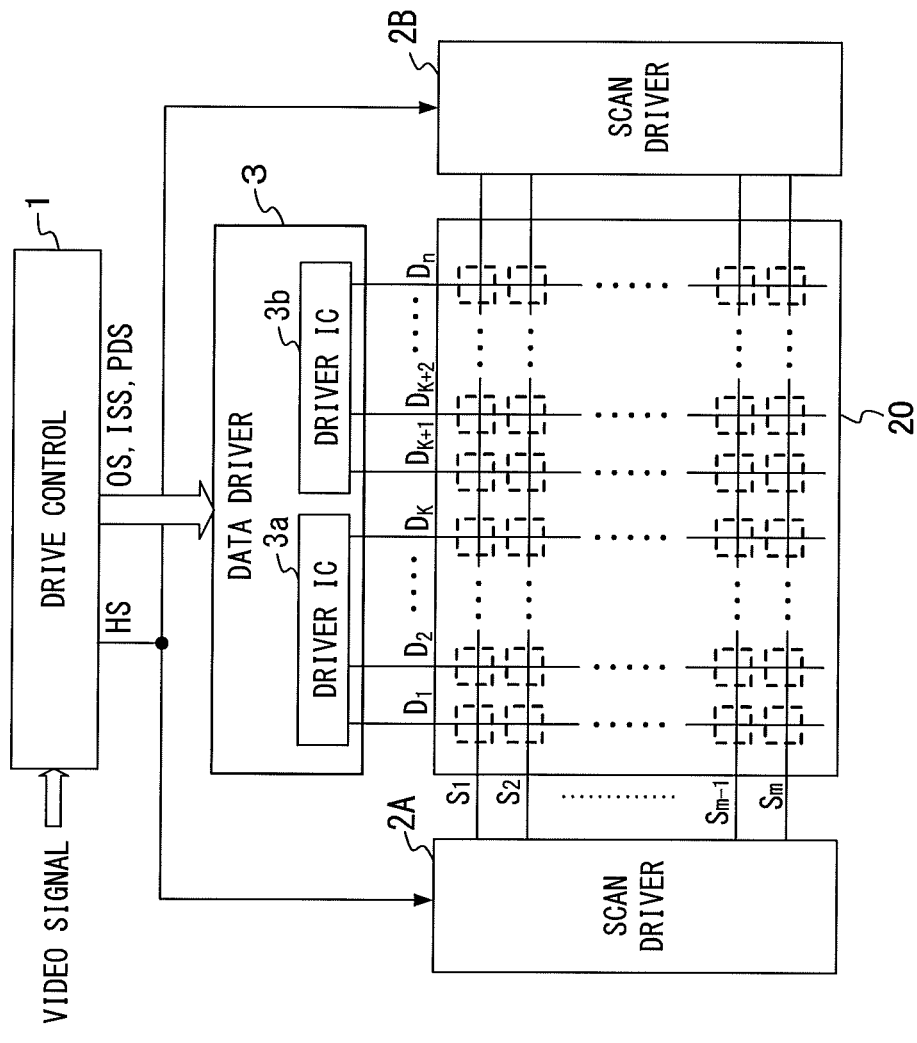
FIG. 1 is a block diagram showing a display apparatus including a display driver according to the present invention.

FIG. 1 is a diagram showing a schematic configuration of a display apparatus including a display driver according to the present invention. As shown in FIG. 1, such the display apparatus includes a drive control part 1, scan drivers 2A and 2B, a data driver 3, and a display device 20.

For example, the display device 20 includes a liquid crystal or organic EL panel. The display device 20 includes m (m is a natural number greater than or equal to 2) horizontal scan lines $S_1$ to $S_m$ each extending in a horizontal direction of a two-dimensional screen and n (n is a natural number greater than or equal to 2) data lines $D_1$ to $D_n$ each extending in a vertical direction of the two-dimensional screen. Display cells taking charge of pixels are formed at the intersections of the horizontal scan lines and the data lines.

The drive control part 1 extracts a horizontal synchronizing signal from a video signal and supplies the horizontal synchronizing signal to the scan drivers 2A and 2B as a horizontal synchronizing signal HS. The drive control part 1 also generates an output start signal OS for instructing a start of output of pixel driving voltages and supplies the output start signal OS to the data driver 3 in synchronization with the horizontal synchronizing signal HS. On the basis of the video signal, the drive control part 1 further generates a series of pixel data PD expressing a luminance level of each pixel, for example, in eight bits pixel by pixel. The drive control part 1 supplies the data driver 3 with a pixel data signal PDS that is obtained by superposing clock information RS expressing clock timing on the series of pixel data PD. The drive control part 1 supplies the data driver 3 with an initial setting signal ISS for making an initial setting of each driver IC (to be described later) formed in the data driver 3. For example, the initial setting signal ISS includes output start delay information LI and delay mode information DM. The output start delay information LI specifies an output start delay time from when the foregoing output start signal OS is supplied to when the pixel driving voltages starts actually being output. The delay mode information DM specifies a delay mode (to be described later).

The scan driver 2A is connected to one end of each of the horizontal scan lines $S_1$ to $S_m$. The scan driver 2B is connected to the other end of each of the horizontal scan lines $S_1$ to $S_m$. The scan drivers 2A and 2B generate a horizontal scan pulse SP in synchronization with the foregoing horizontal synchronizing signal HS, and apply the horizontal scan pulse SP to each of the horizontal scan lines $S_1$ to $S_m$ of the display device 20 in succession.

The data driver 3 takes in the series of pixel data PD in the pixel data signal PDS. Each time the data driver 3 takes in pixel data PD as much as one horizontal scan line, i.e., n pieces of pixel data PD (n is the total number of data lines), the data driver 3 converts the taken-in n pieces of pixel data PD into pixel driving voltages $G_1$ to $G_n$ having a voltage value corresponding to the respective luminance values to indicate. The data driver 3 applies the pixel driving voltages $G_1$ to $G_n$ to the data lines $D_1$ to $D_n$ of the display device 20 in a delay pattern according to the delay mode specified by the delay mode information DM included in the foregoing initial setting signal ISS.

The data driver 3 includes a plurality of semiconductor integrated circuit (IC) chips having the same circuit configuration. For example, in the embodiment shown in FIG. 1, the data driver 3 includes two driver ICs 3a and 3b which are respective independent semiconductor IC chips.

The driver IC 3a takes in K pieces of pixel data PD corresponding to the first to K-th columns (K=n/2) of the display device 20 from among the n pieces of pixel data PD for one horizontal scan line. The driver IC 3a applies the pixel driving voltages $G_1$ to $G_K$ corresponding to the luminance levels indicated by the respective pieces of pixel data PD to the data lines $D_1$ to $D_K$ of the display device 20.

The driver IC 3b takes in K pieces of pixel data PD corresponding to the (K+1)-th to n-th columns of the display device 20 from among the n pieces of pixel data PD for one horizontal scan line. The driver IC 3b applies the pixel driving voltages $G_{K+1}$ to $G_n$ corresponding to the luminance levels indicated by the respective pieces of pixel data PD to the data lines $D_{K+1}$ to $D_n$ of the display device 20.

As shown in FIG. 1, the driver IC 3a in charge of driving the left area of the screen of the display device 20 and the driver IC 3b in charge of driving the right area of the screen of the display device 20 are arranged along one side of the display device 20.

The driver ICs 3a and 3b include the same circuits. Hereinafter, the configuration formed in each driver IC will be described by extracting the driver IC 3a.

Figure 2:
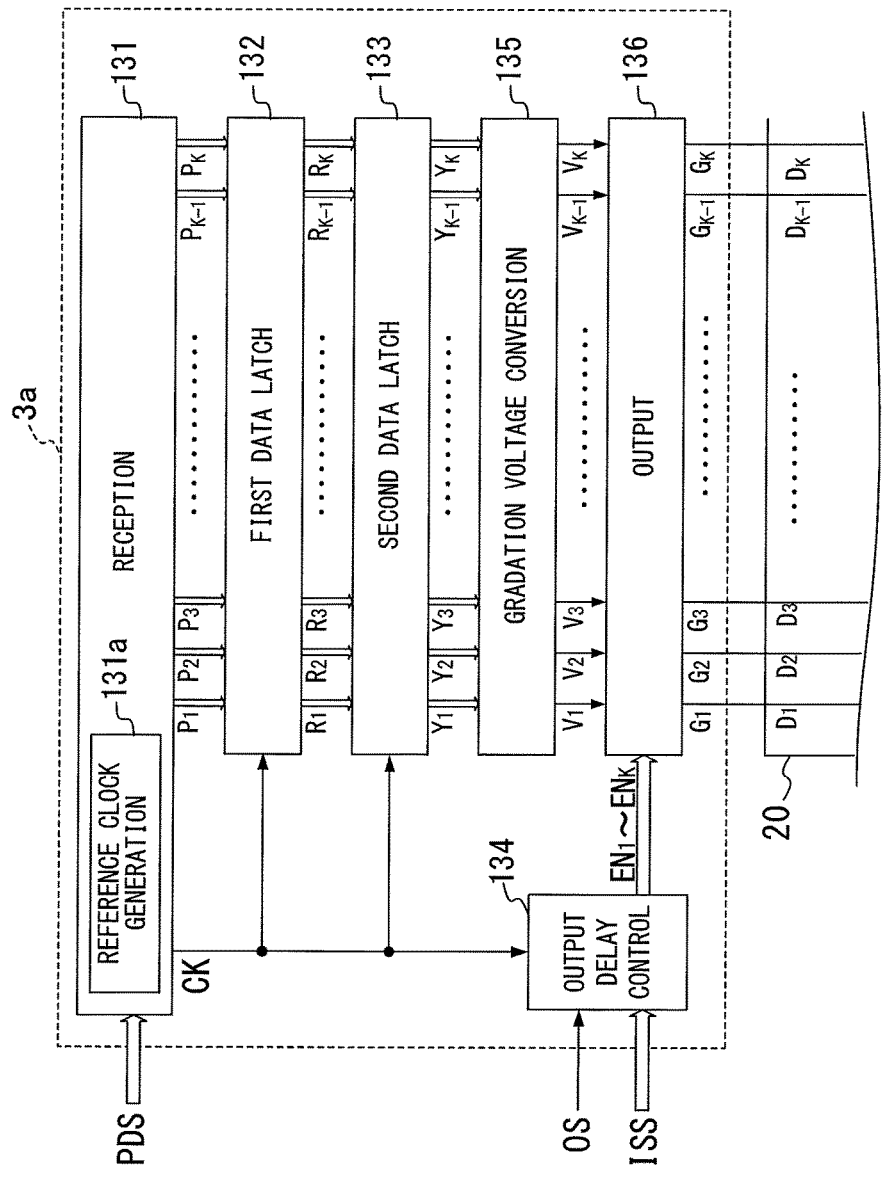

FIG. 2 is a block diagram showing the circuits formed in the driver IC 3a. As shown in FIG. 2, each driver IC includes a reception part 131, a first data latch part 132, a second data latch part 133, an output delay control part 134, a gradation voltage conversion part 135, and an output part 136. The reception part 131 takes in a series of pixel data PD from the pixel data signal PDS supplied from the drive control part 1, and supplies K pieces of pixel data $P_1$ to $P_K$ to the first data latch part 132 from among the (n pieces of) pixel data PD for one horizontal scan line.

A reference clock generation part 131a arranged in the reception part 131 extracts the clock information RS from the pixel data signal PDS to generate a reference clock signal CK which is synchronized in phase with clock timing indicated by the clock information RS. The reception part 131 supplies the reference clock signal CK to the first data latch part 132, the second data latch part 133, and the output delay control part 134.

The first data latch part 132 takes in the pieces of pixel data $P_1$ to $P_K$ supplied from the reception part 131 at timing based on the reference clock signal CK in succession. The first data latch part 132 supplies the pieces of pixel data $P_1$ to $P_K$ to the second data latch part 133 as pieces of pixel data $R_1$ to $R_K$, respectively.

The second data latch part 133 takes in the pieces of pixel data $R_1$ to $R_K$ supplied from the first data latch part 132 at timing based on the reference clock signal CK. The second data latch part 133 supplies the pieces of pixel data $R_1$ to $R_K$ to the gradation voltage conversion part 135 as pieces of pixel data $Y_1$ to $Y_K$, respectively.

The gradation voltage conversion part 135 converts the pieces of pixel data $Y_1$ to $Y_K$ into analog pixel driving voltages $V_1$ to $V_K$ having a voltage value corresponding to the respective luminance levels, and supplies the pixel driving voltages $V_1$ to $V_K$ to the output part 136.

The output delay control part 134 performs initial setting according to the initial setting signal ISS supplied from the drive control part 1. In the delay mode based on the initial setting, the output delay control part 134 generates K output enable signals $EN_1$ to $EN_K$ according to the output start signal OS. The output enable signals $EN_1$ to $EN_K$ differ from each other in start timing of an edge.

Figure 3:
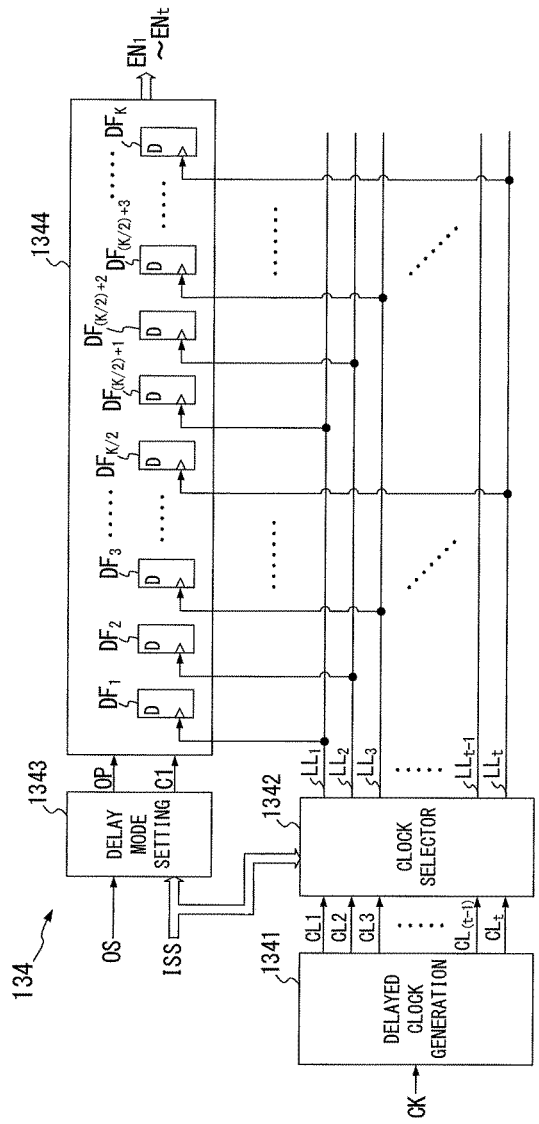
FIG. 3 is a block diagram showing an example of an internal configuration of an output delay control part 134.

FIG. 3 is a block diagram showing an example of an internal configuration of the output delay control part 134. As shown in FIG. 3, the output delay control part 134 includes a delayed clock generation part 1341, a clock selector 1342, a delay mode setting part 1343, and an output enable signal generation part 1344.

Figure 4:
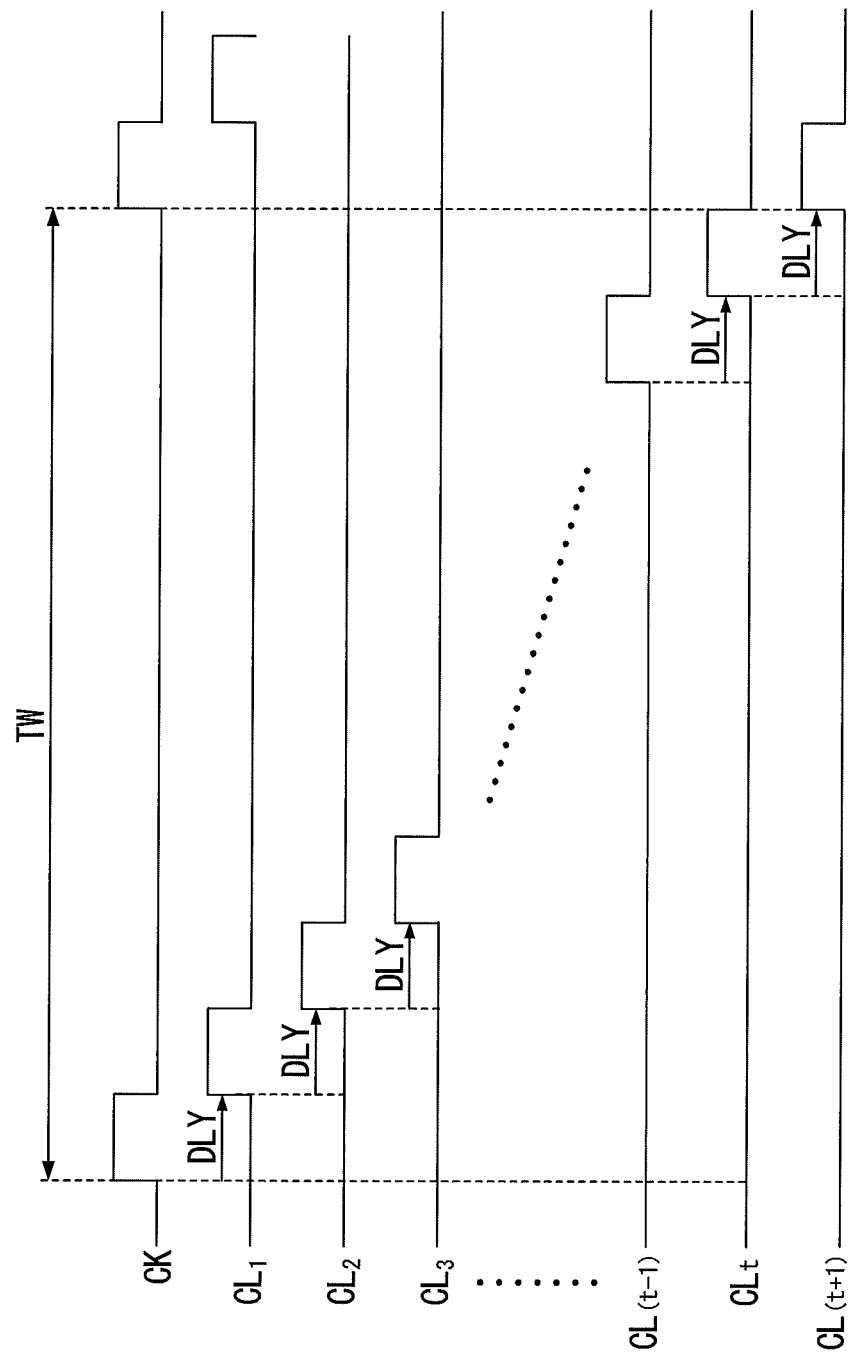
FIG. 4 is a time chart showing delayed clock signals $CL_1$ to $CL_{(I+1)}$.

As shown in FIG. 4, the delayed clock generation part 1341 generates (t+1) number of delayed clock signals $CL_1$ to $CL_{(t+1)}$ (t is a natural number greater than or equal to 2 and less than or equal to K) of which respective front edges have different timing, i.e., different phases based on the reference clock signal CK.

Figure 5:
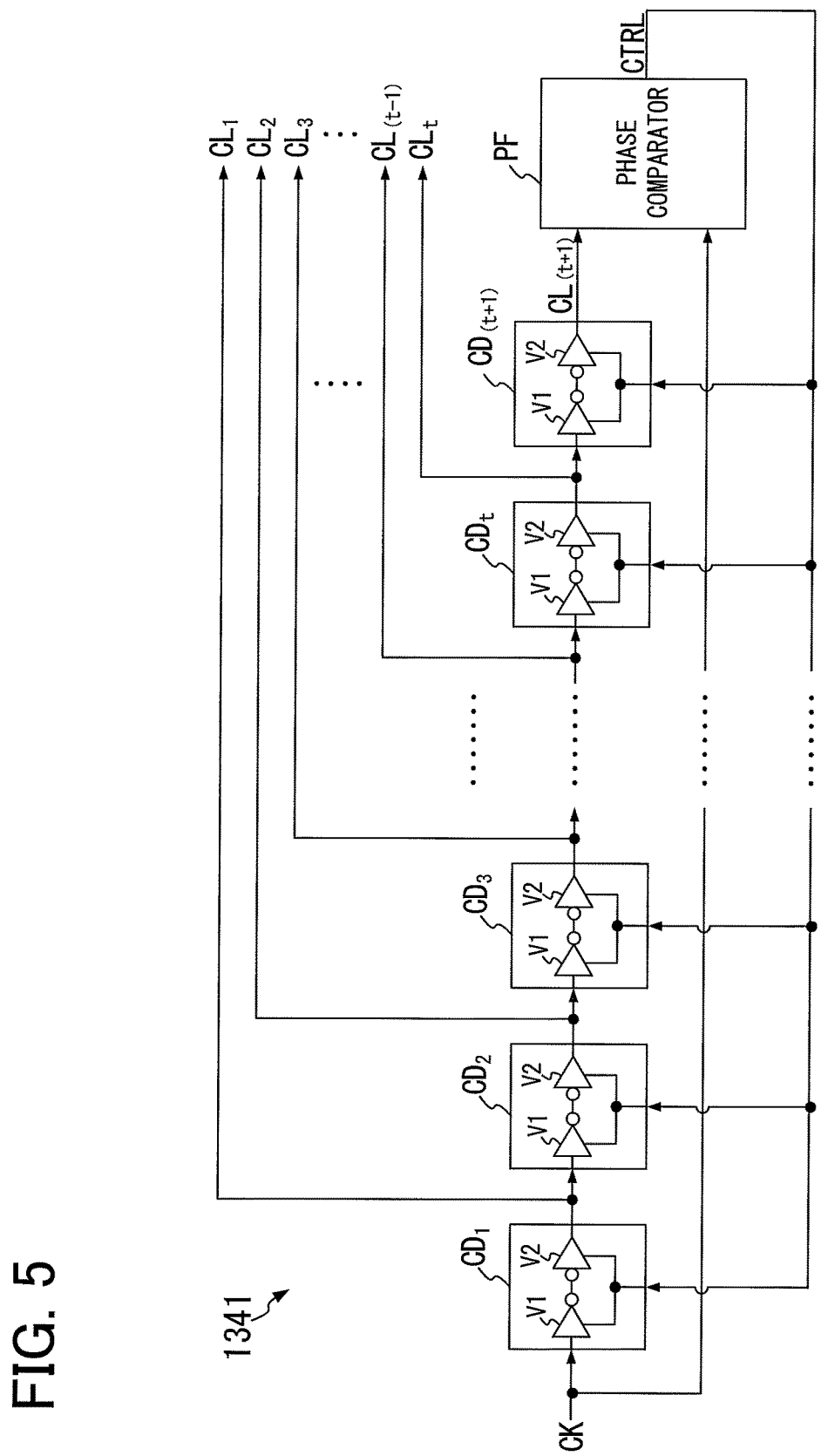
FIG. 5 is a circuit diagram showing an internal configuration of a delayed clock generation part 1341.

FIG. 5 is a block diagram showing an example of an internal configuration of the delayed clock generation part 1341. For example, as shown in FIG. 5, the delayed clock generation part 1341 includes a delay-locked loop (DLL) circuit that includes (t+1) pieces of variable delay circuits $CD_1$ to $CD_{(t+1)}$ connected in series and a phase comparator PF. For example, as shown in FIG. 5, the variable delay circuits $CD_1$ to $CD_{(t+1)}$ each include a pair of variable delay inverters V1 and V2 connected in series.

The variable delay circuits $CD_1$ to $CD_{(t+1)}$ are each designed to have a basic delay time DLY which is equal to one (t+1)-th of a period TW of the reference clock signal CK shown in FIG. 4. The delay time of each of the variable delay circuits $CD_1$ to $CD_{(t+1)}$ is adjusted according to a delay adjustment signal CTRL to be described later.

The variable delay circuit $CD_1$ delays the reference clock signal CK by the basic delay time DLY to generate a delayed clock signal $CL_1$, and supplies the delayed clock signal $CL_1$ to the variable delay circuit $CD_2$. The variable delay circuit $CD_2$ delays the delayed clock signal $CL_1$ by the basic delay time DLY to generate a delayed clock signal $CL_2$, and supplies the delayed clock signal $CL_2$ to the variable delay circuit $CD_3$. Similarly, the variable delay circuit $CD_X$ (X is a natural number of 3 to t) delays a delayed clock signal $CL_{(X-1)}$ supplied from the variable delay circuit $CD_{(X-1)}$ as a previous stage by the basic delay time DLY to generate a delayed clock signal $CL_X$, and supplies the delayed clock signal $CL_X$ to the variable delay circuit $CD_{(X+1)}$ as a subsequent stage. The variable delay circuits $CD_3$ to $CD_t$ generate and supply delayed clock signals $CL_2$ to $CL_t$ to the variable delay circuits CD as the respective subsequent stages.

The variable delay circuit $CD_{(t+1)}$ as a final stage delays the delayed clock signal $CL_t$ by the basic delay time DLY to generate a delayed clock signal $CL_{(t+1)}$, and supplies the delayed clock signal $CL_{(t+1)}$ to the phase comparator PF. As shown in FIG. 4, if the actual delay times of the respective variable delay circuits $CD_1$ to $CD_{(t+1)}$ are equal to the basic delay time DLY, the delayed clock signal $CL_{(t+1)}$ has the same phase as that of the reference clock signal CK.

The phase comparator PF compares the phases of the reference clock signal CK and the delayed clock signal $CL_{(t+1)}$, and generates the delay adjustment signal CTRL which indicates the phase difference therebetween. The phase comparator PF supplies the delay adjustment signal CTRL to each of the variable delay circuits $CD_1$ to $CD_{(t+1)}$. As a result, the variable delay circuits $CD_1$ to $CD_{(t+1)}$ each adjust their own delay time at the current point in time in a leading direction or a lagging direction as much as the phase difference indicated by the delay adjustment signal CTRL.

In short, the delayed clock generation part 1341 generates the delayed clock signals $CL_h$ (h is an integer of 1 to (t+1)) of which the respective front edges lag behind a front edge of the reference clock signal CK by h·DLY, i.e., the delayed clock signals $CL_1$ to $CL_{(t+1)}$ shown in FIG. 4 in synchronization with the reference clock signal CK. In the delayed clock generation part 1341, the delay time of each of the delayed clock signals $CL_1$ to $CL_{(t+1)}$ is adjusted by the delay adjustment signal CTRL generated by the phase comparator PF to be constantly equal to the basic delay time DLY regardless of manufacturing variations and ambient temperature.

The delayed clock generation part 1341 supplies the clock selector 1342 with the delayed clock signals $CL_1$ to $CL_t$ among the delayed clock signals $CL_1$ to $CL_{(t+1)}$ generated as described above.

The clock selector 1342 sends out the delayed clock signals $CL_1$ to $CL_t$ to respective corresponding clock lines LL according to a correspondence relationship between each of the delayed clock signals $CL_1$ to $CL_t$ and each of the clock lines $LL_1$ to $LL_t$ based on the delay mode information DM included in the initial setting signal ISS. The delay mode information DM specifies any one of an L shift mode (first shift mode), an R shift mode (second shift mode), and a V shift mode (third shift mode).

More specifically, if the delay mode information DM indicates the L shift mode, the clock selector 1342 sends out the delayed clock signals $CL_1$ to $CL_t$ to the clock lines $LL_1$ to $LL_t$ according to a one-to-one correspondence relationship shown in FIG. 6A. If the delay mode information DM indicates the R shift mode, the clock selector 1342 sends out the delayed clock signals $CL_t$ to $CL_1$ to the clock lines $LL_1$ to $LL_t$ according to a one-to-one correspondence relationship shown in FIG. 6B. If the delay mode information DM indicates the V shift mode, the clock selector 1342 of the driver IC 3a sends out the delayed clock signals $CL_1$ to $CL_t$ to the clock lines $LL_1$ to $LL_t$ according to the one-to-one correspondence relationship shown in FIG. 6A. The clock selector 1342 of the driver IC 3b sends out the delayed clock signals $CL_t$ to $CL_1$ to the clock lines $LL_1$ to $LL_t$ according to the one-to-one correspondence relationship shown in FIG. 6B.

The clock selector 1342 does not necessarily need to send out all the delayed clock signals $CL_1$ to $CL_t$ to the clock lines $LL_1$ to $LL_t$. For example, the clock selector 1342 may send out odd-numbered (or even-numbered) delayed clock signals CL among the delayed clock signals $CL_1$ to $CL_t$ to the clock lines $LL_1$ to $LL_t$ according to a one-to-two correspondence relationship. In essence, the clock selector 1342 may send out a specific plurality of delayed clock signals CL among the delayed clock signals $CL_1$ to $CL_t$ to the clock lines $LL_1$ to $LL_t$.

The delay mode setting part 1343 shown in FIG. 3 initially stores the output start delay information LI and the delay mode information DM indicated by the initial setting signal ISS supplied from the drive control part 1 into a built-in register (not shown).

If the delay mode specified by the delay mode information DM is the L shift mode, the delay mode setting part 1343 supplies a switch signal C1 having a logical level of 0 to the output enable signal generation part 1344. If the delay mode is the R shift mode, the delay mode setting part 1343 outputs the switch signal C1 having a logical level of 1 to the output enable signal generation part 1344.

If the delay mode is the V shift mode, the delay mode setting part 1343 of the driver IC 3a supplies the switch signal C1 having a logical level of 0 to the output enable signal generation part 1344 as with the case where the delay mode is the L shift mode. If the delay mode is the V shift mode, the delay mode setting part 1343 of the driver IC 3b supplies the switch signal C1 having a logical level of 1 to the output enable signal generation part 1344 as with the case where the delay mode is the R shift mode.

The delay mode setting part 1343 generates an output start signal OP which transitions from a state of having a logical level of 0 (or 1) to a state of having a logical level of 1 (or 0) at a point in time when the output start delay time indicated by the output start delay information LI has elapsed since the reception of the output start signal OS transmitted from the drive control part 1. The delay mode setting part 1343 supplies the output start signal OP to the output enable signal generation part 1344.

The output enable signal generation part 1344 includes a shift register including K pieces of D flip-flops $DF_1$ to $DF_K$ which take in and supply the output start signal OP to the D flip-flops as the subsequent stages or the previous stages.

A configuration of the output enable signal generation part 1344 serving as the shift register mentioned above will be described below by using a case where K is twice the number of clock lines $LL_1$ to $LL_t$, i.e., 2·t as an example. As shown in FIG. 3, the clock terminals of the D flip-flops $DF_1$ to $DF_{K/2}$ among the D flip-flops $DF_1$ to $DF_K$ are connected to the clock lines $LL_1$ to $LL_t$, respectively. The clock terminals of the D flip-flops $DF_{(K/2)+1}$ to $DF_K$ among the D flip-flops $DF_1$ to $DF_K$ are connected to the clock lines $LL_1$ to $LL_t$, respectively.

Figure 7:
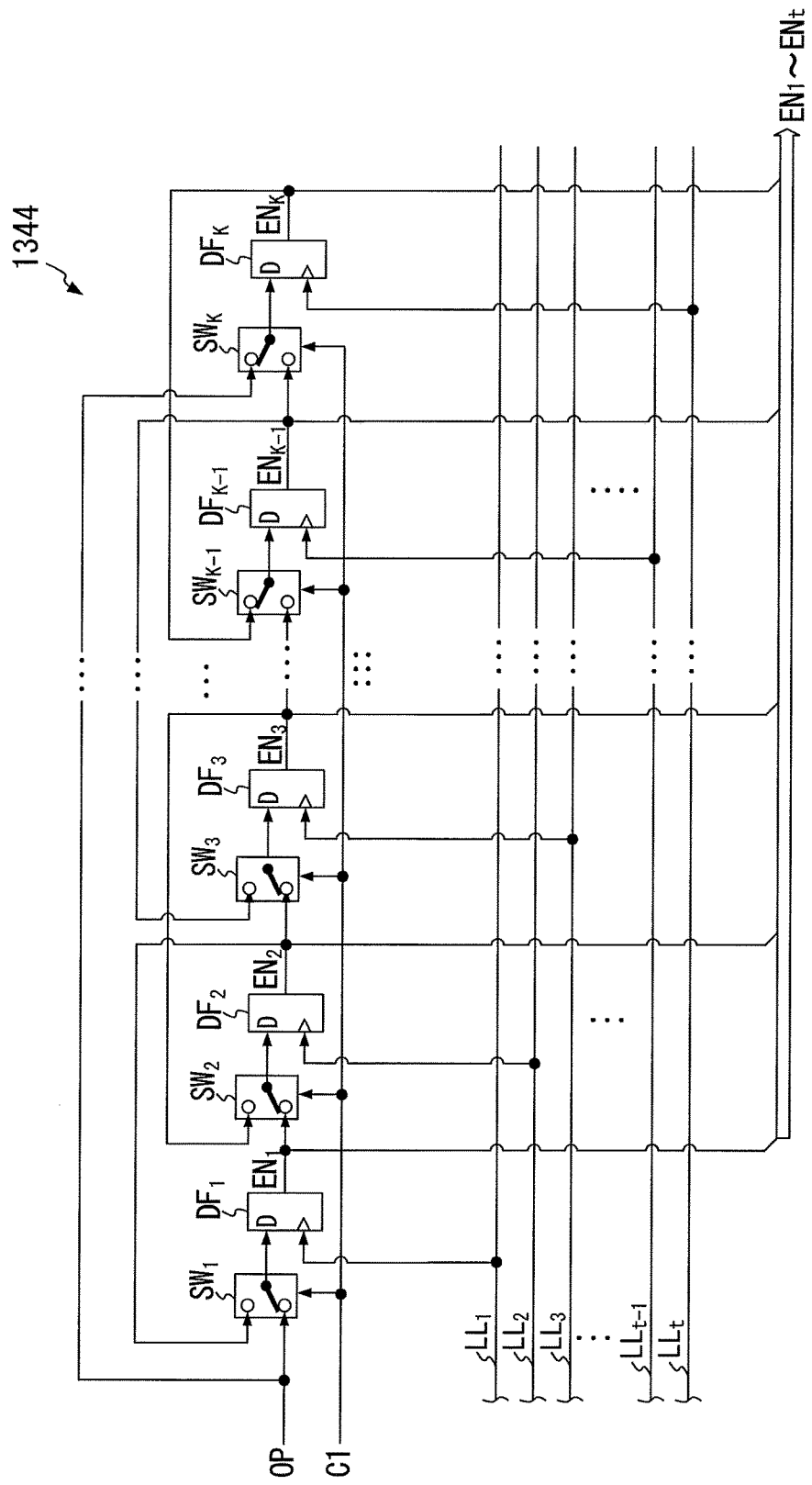
FIG. 7 is a circuit diagram showing an internal configuration of an output enable signal generation part 1344.

As shown in FIG. 7, aside from the D flip-flops $DF_1$ to $DF_K$, the output enable signal generation part 1344 includes shift direction changeover switches $SW_1$ to $SW_K$ for switching a shift direction.

In FIG. 7, the D flip-flops $DF_1$ to $DF_K$ are connected in series via the shift direction changeover switches SW arranged at the respective previous stages. The outputs of the D flip-flops $DF_1$ to $DF_K$ serve as the output enable signals $EN_1$ to $EN_K$, respectively.

The shift direction changeover switch $SW_1$ selects either one of the output start signal OP and the output enable signal $EN_2$ output from the D flip-flop $DF_2$ according to the switch signal C1, and supplies the selected signal to the D flip-flop $DF_1$. The shift direction changeover switch $SW_r$ (r is a natural number of 2 to (K−1)) selects either one of the output enable signal $EN_{r-1}$ output from the D flip-flop $DF_{r-1}$ and the output enable signal $EN_{r+1}$ output from the D flip-flop $DF_{r+1}$ according to the switch signal C1, and supplies the selected signal to the D flip-flop $DF_r$. The shift direction changeover switch $SW_K$ selects either one of the output start signal OP and the output enable signal $EN_{K-1}$ output from the D flip-flop $DF_{K-1}$ according to the switch signal C1, and supplies the selected signal to the D flip-flop $DF_K$.

Figure 8:
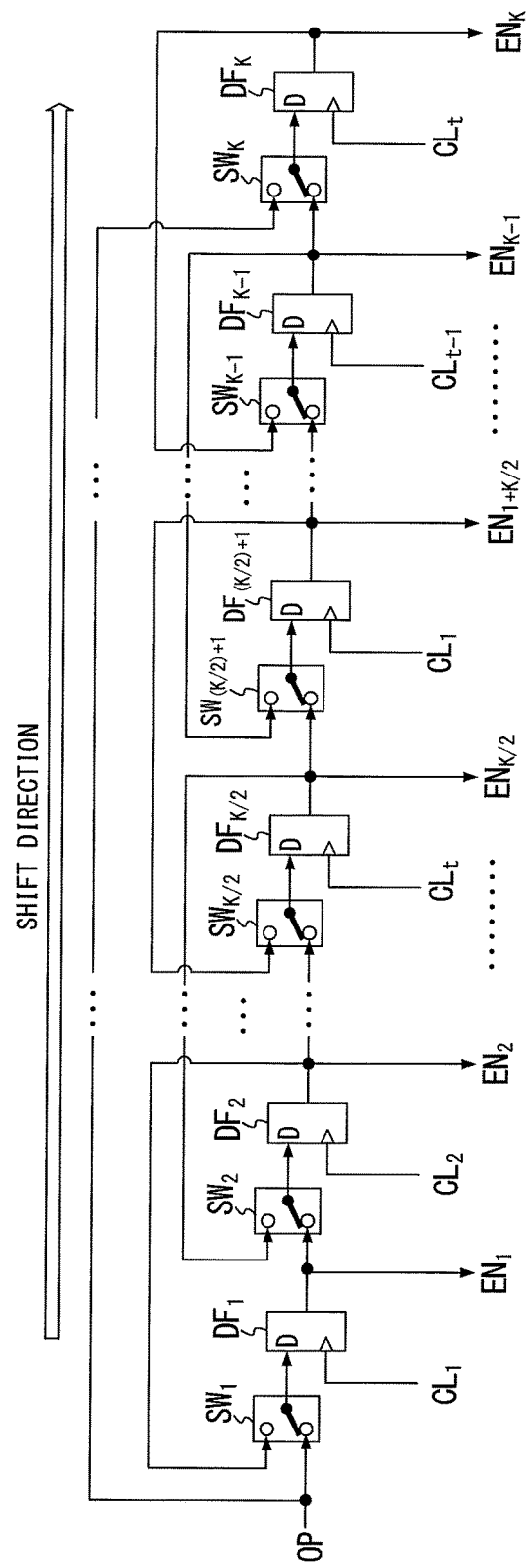
FIG. 8 is a diagram showing a state of shift direction changeover switches $SW_1$ to $SW_K$ in an L shift mode.

Specifically, if the delay mode specified by the delay mode information DM is the L shift mode, as shown in FIG. 8, the shift direction changeover switch $SW_1$ selects and supplies the output start signal OP to the D flip-flop $DF_1$ according to the switch signal C1 having a logical level of 0. In the L shift mode, as shown in FIG. 8, the shift direction changeover switch $SW_S$ (S is an natural number of 2 to K) selects and supplies the output enable signal $EN_{S-1}$ output from the D flip-flop $DF_{S-1}$ to the D flip-flop $DF_S$.

As a result, in the L shift mode, the output start signal OP is initially taken into the D flip-flop $DF_1$ in synchronization with the delayed clock signal $CL_1$ shown in FIG. 4. The output start signal OP is subsequently shifted to and taken into the D flip-flops DF in order of $DF_2$, $DF_3$, ..., $DF_{K-1}$, and $DF_K$ in synchronization with the delayed clock signals $CL_2$ to $CL_t$, respectively. In the L shift mode, the D flip-flops $DF_1$ to $DF_K$ thus generate the output enable signals $EN_h$ (h is an integer of 1 to (t+1)), of which the respective front edges lag behind the front edge of the output start signal OP by h·DLY, according to the output start signal OP. That is, the D flip-flops $DF_1$ to $DF_K$ generate the output enable signals $EN_1$ to $EN_K$ shown in FIG. 9.

Figure 10:
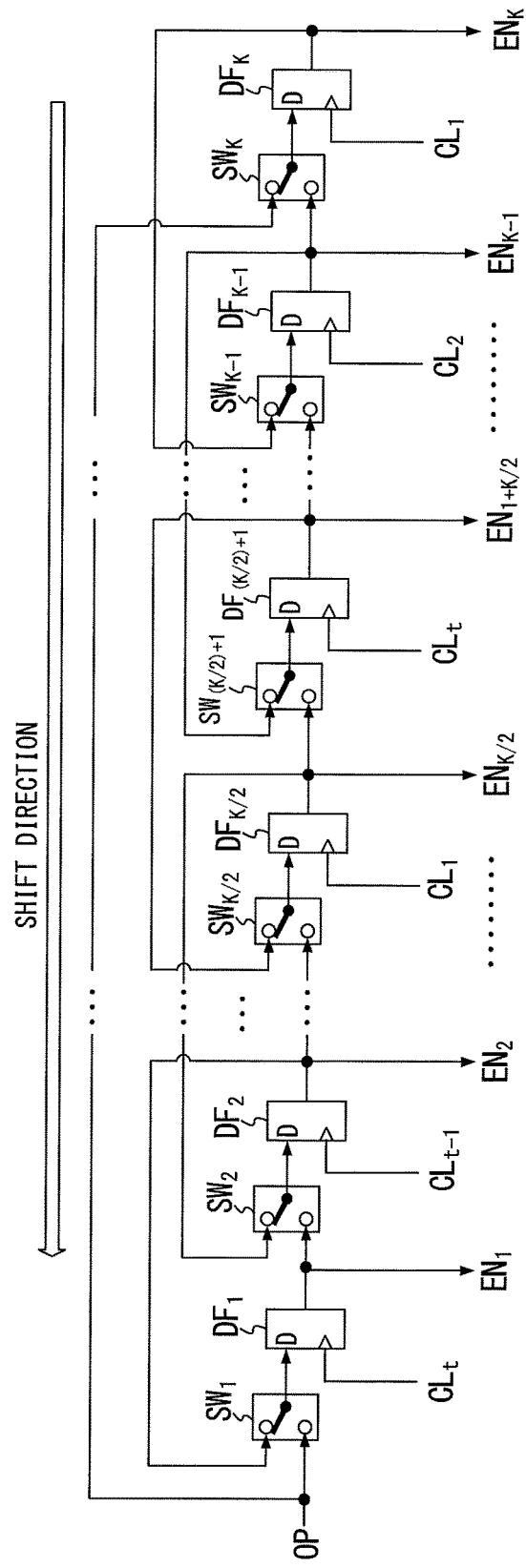
FIG. 10 is a diagram showing the state of the shift direction changeover switches $SW_1$ to $SW_K$ in an R shift mode.

If the delay mode is the R shift mode, as shown in FIG. 10, the shift direction changeover switch $SW_K$ selects and supplies the output start signal OP to the D flip-flop $DF_K$ according to the switch signal C1 having a logical level of 1. In the R shift mode, the shift direction changeover switch $SW_J$ (J is a natural number of 1 to (K−1)) selects and supplies the output enable signal $EN_{J+1}$ output from the D flip-flop $DF_{J+1}$ to the D flip-flop $DF_J$.

As a result, in the R shift mode, the output start signal OP is initially taken into the D flip-flop $DF_K$ in synchronization with the delayed clock signal $CL_1$ shown in FIG. 4. The output start signal OP is subsequently shifted to and taken into the D flip-flops DF in order of $DF_{K-1}$, $DF_{K-2}$, ..., $DF_2$, and $DF_1$ in synchronization with the delayed clock signals $CL_2$ to $CL_t$, respectively. In the R shift mode, the D flip-flops $DF_1$ to $DF_K$ thus generate the output enable signals $EN_h$ (h is an integer of 1 to (t+1)), of which the respective front edges lag behind the front edge of the output start signal OP by (K−h+1)·DLY, according to the output start signal OP. That is, the D flip-flops $DF_1$ to $DF_K$ generate the output enable signals $EN_1$ to $EN_K$ shown in FIG. 11.

Figure 9:
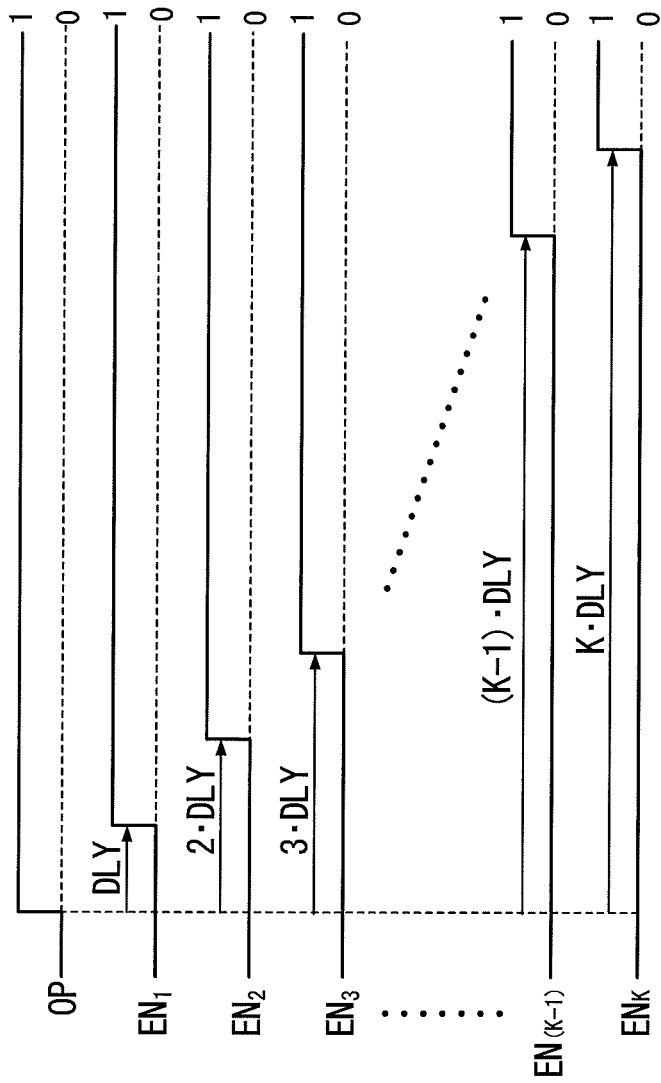
FIG. 9 is a time chart showing output enable signals $EN_1$ to $EN_K$ in the L shift mode.

If the delay mode is the V shift mode, the output enable signal generation part 1344 of the driver IC 3a performs the operation of the L shift mode described above to generate the output enable signals $EN_1$ to $EN_K$ shown in FIG. 9. Moreover, in the V shift mode, the output enable signal generation part 1344 of the driver IC 3b performs the operation of the R shift mode described above to generate the output enable signals EN' to $EN_K$ shown in FIG. 11.

Figure 11:
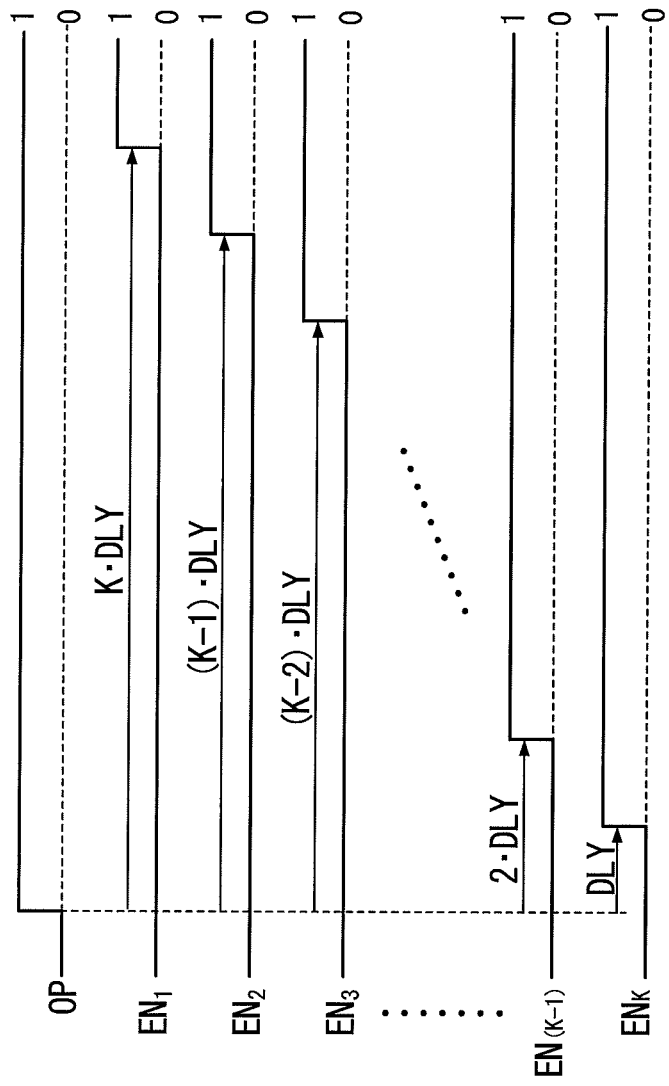
FIG. 11 is a time chart showing the output enable signals $EN_1$ to $EN_K$ in the R shift mode.

With the configuration described above, the output delay control part 134 generates the output enable signals $EN_1$ to $EN_K$ shown in FIG. 9 or 11, of which the respective front edges lag behind the front edge of the output start signal OP by h·DLY (h is an integer of 1 to (t+1)), according to the delay mode indicated by the initial setting signal ISS. The output delay control part 134 supplies the output enable signals $EN_1$ to $EN_K$ to the output part 136.

Figure 12:
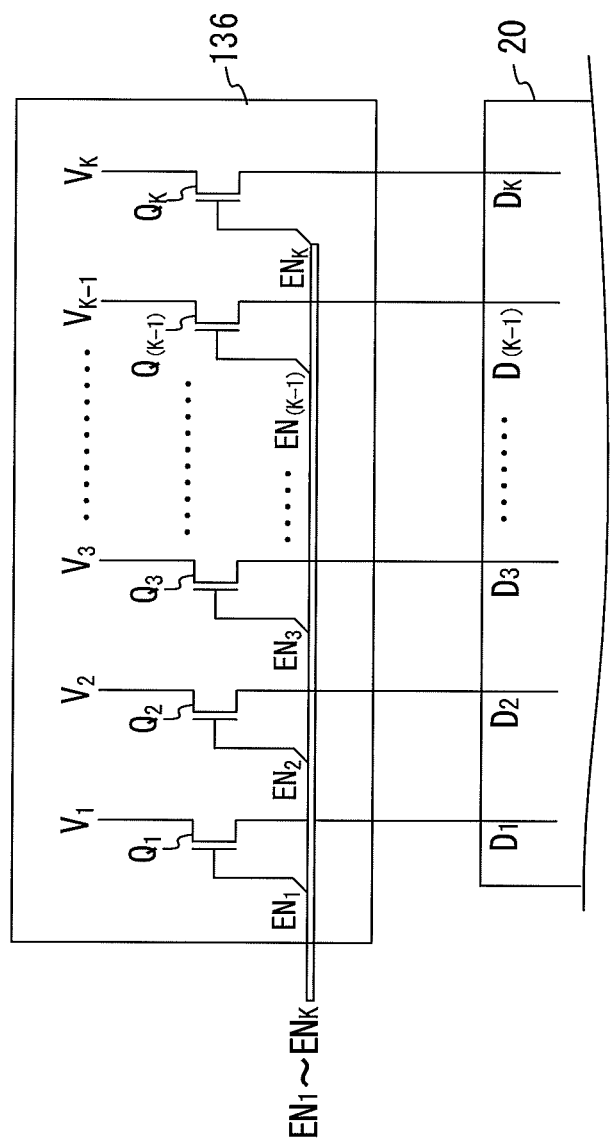
FIG. 12 is a circuit diagram showing part of an internal configuration of an output part 136.

As shown in FIG. 12, the output part 136 includes transistors $Q_1$ to $Q_K$ serving as transmission gates. The pixel driving voltage $V_1$ to $V_K$ supplied from the gradation voltage conversion part 135 are supplied to the source terminals of the transistors $Q_1$ to $Q_K$, respectively. The drain terminals of the transistors $Q_1$ to $Q_K$ are connected to K pieces of data lines D of the display device 20, respectively.

The output enable signals $EN_1$ to $EN_K$ are independently supplied to the gate terminals of the transistors $Q_1$ to $Q_K$, respectively. The transistors $Q_1$ to $Q_K$ are independently controlled on/off based on the output enable signals $EN_1$ to $EN_K$, respectively. More specifically, if the output enable signal $EN_j$ (j is a natural number of 1 to K) indicates a logical level of 0, the transistor $Q_j$ turns off. If the output enable signal $EN_j$ indicates a logical level of 1, the transistor $Q_j$ turns on, whereby the pixel driving voltage V is applied to the data line $D_j$ of the display device 20 as the pixel driving voltage $G_j$.

An operation of the data driver 3 including the driver ICs 3a and 3b having the foregoing configuration will be described below with respect to each of the following L shift mode, R shift mode, and V shift mode.

[L Shift Mode]

In the L shift mode, the drive control part 1 supplies the driver ICs 3a and 3b with the initial setting signal ISS that includes the delay mode information DM specifying the L shift mode. Here, the drive control part 1 supplies the driver IC 3a with the initial setting signal ISS that includes the output start delay information LI indicating an output delay time of 0. The drive control part 1 supplies the driver IC 3b with the initial setting signal ISS that includes the output start delay information LI indicating an output delay time of T1. For example, the output delay time T1 is the time from when the output start signal OS is supplied to when the last pixel driving voltage G to be applied to the driver IC 3a starts to be applied.

Figure 13A:
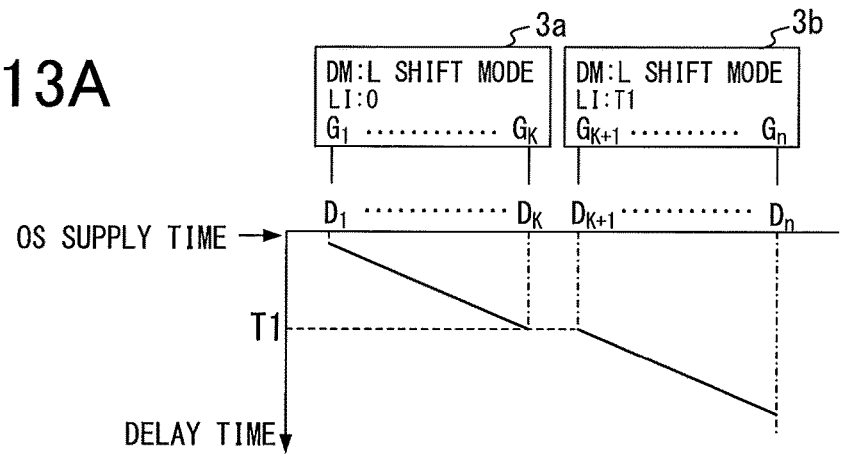
FIGS. 13A to 13C are diagrams showing a pattern of output delays in respective delay modes (L shift mode, R shift mode, and V shift mode).

Consequently, in the L shift mode, as shown in FIG. 13A, the driver IC 3a first applies the pixel driving voltages $G_1$ to $G_K$ of which the application timing is delayed in order of $G_1$, $G_2$, $G_3$, ..., $G_K$ to the data lines $D_1$, $D_2$, $D_3$, ..., $D_K$ of the display device 20 in succession. After the output delay time T1 has elapsed since the supply of the output start signal OS, the driver IC 3b applies the pixel driving voltages $G_{K+1}$ to $G_n$ of which the application timing is delayed in order of $G_{K+1}$, $G_{K+2}$, $G_{K+3}$, ..., $G_n$ to the data lines $D_{K+1}$, $D_{K+2}$, $D_{K+3}$, ..., $D_n$ of the display device 20 in succession.

[R Shift Mode]

In the R shift mode, the drive control part 1 supplies the driver ICs 3a and 3b with the initial setting signal ISS that includes the delay mode information DM specifying the R shift mode. Here, the drive control part 1 supplies the driver IC 3a with the initial setting signal ISS that includes the output start delay information LI indicating an output delay time of T1. The drive control part 1 supplies the driver IC 3b with the initial setting signal ISS that includes the output start delay information LI indicating an output delay time of 0. For example, the output delay time T1 is the time from when the output start signal OS is supplied to when the last pixel driving voltage G to be applied to the driver IC 3b starts to be applied.

Figure 13B:
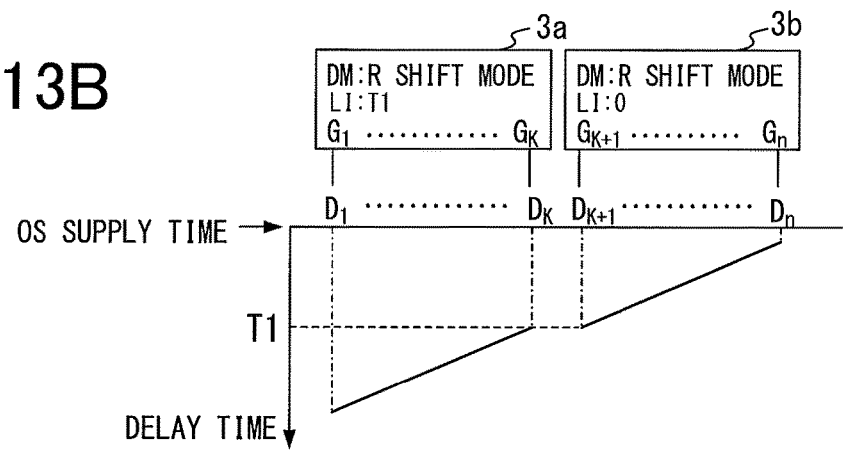

Consequently, in the R shift mode, as shown in FIG. 13B, the driver IC 3b first applies the pixel driving voltage $G_n$ to $G_{K+1}$ of which the application timing is delayed in order of $G_n$, $G_{n-1}$, $G_{n-2}$, ..., $G_{K+1}$ to the data lines $D_n$, $D_{n-1}$, $D_{n-2}$, ..., $D_{K+1}$ of the display device 20 in succession. After the output delay time T1 has elapsed since the supply of the output start signal OS, the driver IC 3a applies the pixel driving voltages $G_K$ to $G_1$ of which the application timing is delayed in order of $G_K$, $G_{K-1}$, $G_{K-2}$, ..., $G_1$ to the data lines $D_K$, $D_{K-1}$, $D_{K-2}$, ..., $D_1$ of the display device in succession.

[V Shift Mode]

In the V shift mode, the drive control part 1 supplies the driver IC 3a with the initial setting signal ISS that includes the delay mode information DM specifying the L shift mode and the output start delay information LI indicating an output delay time of 0. The drive control part 1 supplies the driver IC 3b with the initial setting signal ISS that includes the delay mode information DM specifying the R shift mode and the output start delay information LI indicating an output delay time of 0.

Figure 13C:
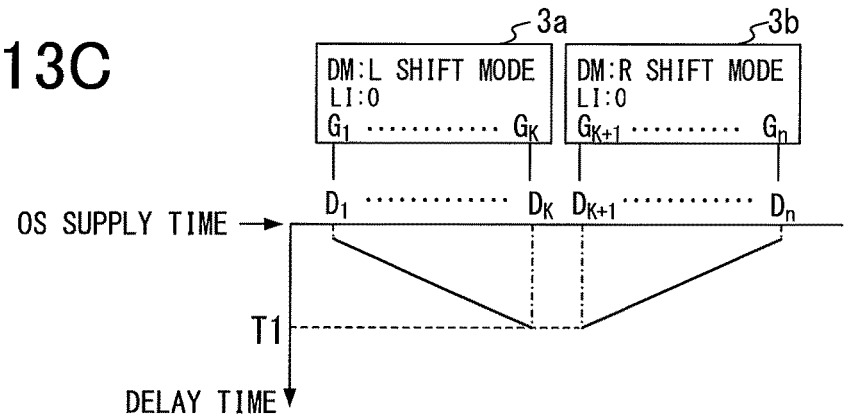

As a result, in the V shift mode, as shown in FIG. 13C, the driver IC 3a applies the pixel driving voltages $G_1$ to $G_K$ of which the application timing is delayed in order of $G_1$, $G_2$, $G_3$, ..., $G_K$ to the data lines $D_1$, $D_2$, $D_3$, ..., $D_K$ of the display device 20 in succession. In parallel with such an operation of the driver IC 3a, as shown in FIG. 13C, the driver IC 3b applies the pixel driving voltages $G_n$ to $G_{K+1}$ of which the application timing is delayed in order of $G_n$, $G_{n-1}$, $G_{n-2}$, ..., $G_{K+1}$ to the data lines $D_n$, $D_{n-1}$, $D_{n-2}$, ..., $D_{K+1}$ of the display device 20 in succession.

Here, the display cells belonging to the horizontal scan line S to which the horizontal scan pulse SP is applied among the horizontal scan lines $S_1$ to $S_m$ of the display device 20 perform display with luminances corresponding to the pixel driving voltages G applied to the respective data lines $D_1$ to $D_n$.

As described above, the data driver 3 forcedly shifts the timing at which to apply the pixel driving voltages G to the respective data lines D as shown in FIG. 13A, 13B, or 13C. This can prevent the currents flowing into the data lines from concentrating at the same point in time. As a result, noise occurring in such a state can be suppressed.

If the display device 20 has a large screen size, the horizontal scan lines S extending in the horizontal direction of the two-dimensional screen, in particular, increase in wiring resistance. To reduce the load of the scan driver due to the wiring resistance, the display apparatus shown in FIG. 1 includes the scan drivers (2A and 2B) arranged at both ends of the horizontal scan lines S. On each of the horizontal scan lines $S_1$ to $S_m$, the delay amount of the horizontal scan pulse SP due to the wiring resistance increases as the position gets farther from both the scan drivers 2A and 2B, i.e., as the position approaches the screen center. If the scan drivers 2A and 2B apply the horizontal scan pulse SP to a horizontal scan line S, the horizontal scan pulse SP reaches the intersection with the data line $D_{n/2}$ (or $D_{(n/2)+1}$) belonging to the screen center area with a delay with respect to the horizontal scan pulse SP arising at the intersection with the data line $D_1$ (or $D_n$) belonging to the left (or right) end area of the screen.

According to the V shift mode, the closer the data lines D are located to the screen center, the more the application timing of the pixel driving voltages G can be delayed to follow the delay time which is a time period for the horizontal scan pulse SP to reach each data line D. As a result, the application timing of the horizontal scan pulse SP and that of the pixel driving voltages G can be matched with each other.

To shift the output timing of the pixel driving voltages $G_1$ to $G_n$ to the display device 20 as shown in FIGS. 13A to 13C, the output delay control part 134 shown in FIG. 3 is configured to generate the delayed clock signals $CL_1$ to $CL_t$ having phases different from each other by the delayed clock generation part 1341. In the delayed clock generation part 1341, the variable delay circuits $CD_1$ to $CD_{(t+1)}$ for delaying a signal by using their element delay (basic delay time DLY) are connected in series as shown in FIG. 5. The reference clock signal CK is supplied to the variable delay circuit CD' as a first stage. Consequently, as shown in FIG. 4, the delayed clock signals $CL_1$ to $CL_{(t+1)}$ of which the respective front edges lag behind the front edge of the reference clock signal CK by h·DLY (h is an integer of 1 to (t+1)) are obtained as the outputs of the respective variable delay circuits $CD_1$ to $CD_{(t+1)}$.

The relationship of the basic delay time DLY to the period TW of the reference clock signal CK is given by:

$$TW=(t+1) \cdot DLY.$$

If the actual delay amount of each of the variable delay circuits $CD_1$ to $CD_{(t+1)}$ is equal to the basic delay time DLY, the design value, then the phase of the delayed clock signal $CL_{(t+1)}$ coincides with that of the reference clock signal CK. However, the element delay amounts of the variable delay circuits $CD_1$ to $CD_{(t+1)}$ vary due to manufacturing variations, ambient temperature, etc.

The delayed clock generation part 1341 then detects a phase difference between the phase of the reference clock signal CK and that of the delayed clock signal $CL_{(t+1)}$ by using the phase comparator PF. On the basis of the delay adjustment signal CTRL indicating the phase difference, the delayed clock generation part 1341 adjusts the delay amount of each of the variable delay circuits $CD_1$ to $CD_{(t+1)}$ so that the phase difference converges to zero.

Consequently, according to the output delay control part 134 including the delayed clock generation part 1341, the element delay amounts of the variable delay circuits $CD_1$ to $CD_{(t+1)}$ can always be maintained to the constant basic delay time DLY even if the element delay amounts vary due to manufacturing variations, ambient temperature, etc.

In such a manner, the application timing of the pixel driving voltages to the data lines can be matched with the application timing of the horizontal scan pulse to the display cells via the horizontal scan lines regardless of manufacturing variations or ambient temperature. As a result, a high-quality image without uneven luminance can be displayed.

As described above, the driver ICs 3a and 3b included in the data driver 3 each include the following a delayed clock generation part (1341), an output enable signal generation part (1344) and an output part (136). The delayed clock generation part generates first to t-th delayed clock signals ($CL_1$ to $CL_t$) having phases different from each other on the basis of the reference clock signal (CK). The output enable signal generation part generates first to K-th output enable signals ($EN_1$ to $EN_K$) on the basis of the first to t-th delayed clock signals. The output part apply K pixel driving voltages ($G_1$ to $G_K$) to the K data lines at respective different timings on the basis of the first to K-th output enable signals. The delayed clock generation part includes a phase comparator (PF) and a variable delay circuit group constituted by first to (t+1)-th variable delay circuits ($CD_1$ to $CD_{t+1}$) each having a basic delay time (DLY) which is one (t+1)-th of a period (TW) of the reference clock signal are connected in series with each other. The reference clock signal is supplied to the variable delay circuit ($CD_1$) as the first stage in the variable delay circuit group. The outputs of the respective variable delay circuits ($CD_1$ to $CD_t$) as first to t-th stages in the variable delay circuit group serve as the first to t-th delayed clock signals. The phase comparator then adjusts the delay time of each of the variable delay circuits in the variable delay circuit group on the basis of a phase difference between the signal ($CL_{t+1}$) output from the variable delay circuit ($CD_{t+1}$) as a (t+1)-th stage and the reference clock signal.

With such a configuration, noise occurring from the concentration of currents flowing into the display device can be suppressed, and a high-quality image without uneven luminance can be displayed regardless of manufacturing variations or ambient temperature.

This application is based on Japanese Patent Application No. 2014-171670 which is herein incorporated by reference.

What is claimed is:

1. A display driver which drives a display device, by applying K (K is an integer greater than or equal to 2) pixel driving voltages corresponding to pixel-by-pixel luminance levels indicated by an image data signal to K data lines of said display device, respectively, said driver comprising:
    a delayed clock generation part configured to generate first to t-th (t is an integer less than or equal to K and greater than or equal to 2) delayed clock signals having phases different from each other and being synchronized with a reference clock signal;
    an output enable signal generation part configured to generate first to K-th output enable signals on the basis of said first to t-th delayed clock signals, wherein said output enable signal generation part includes a shift register including first to K-th flip-flops connected in series, wherein said first to K-th flip-flops are each supplied with any one of said first to t-th delayed clock signals, and wherein outputs of said first to K-th flip-flops serve as said first to K-th output enable signals respectively; and
    an output part configured to apply the K pixel driving voltages to the K data lines at respective different timings on the basis of said first to K-th output enable signals,
    wherein:
    said delayed clock generation part includes a phase comparator and a variable delay circuit group constituted by first to (t+1)-th variable delay circuits each having a basic delay time which is one (t+1)-th of a period of said reference clock signal are connected in series with each other;
    said reference clock signal is supplied to the first variable delay circuit;
    outputs of the first to t-th variable delay circuits in said variable delay circuit group serve as said first to t-th delayed clock signals respectively; and
    said phase comparator adjusts a delay time of each of the first to t-th variable delay circuits in the variable delay circuit group on the basis of a phase difference between a signal output from the (t+1)-th variable delay circuit and said reference clock signal.

2. The display driver according to claim 1, wherein each of the first to t-th variable delay circuits is a variable delay element having an element delay of said basic delay time.

3. The display driver according to claim 2, wherein
    said shift register has
    a first shift mode in which to shift an output start signal in said first to K-th flip-flops in order of the first flip-flop, the second flip-flop, the third flip-flop, . . . , the (K−1)-th flip-flop, and the K-th flip-flop, whereby timing to apply the pixel driving voltages to the data lines is delayed in order of the first output enable signal, the second output enable signal, the third output enable signal, . . . , the (K−1)-th output enable signal, and the K-th output enable signal, and a second shift mode in which to shift said output start signal in said first to K-th flip-flops in order of the K-th flip-flop, the (K−1)-th flip-flop, . . . , the third flip-flop, the second flip-flop, the first flip-flop, whereby the timing to apply the pixel driving voltages to the data lines is delayed in order of the K-th output enable signal, the (K−1)-th output enable signal, . . . , the third output enable signal, the second output enable signal, and the first output enable signal, the driver further comprising a delay mode setting part for setting which to make an operation in, said first shift mode or said second shift mode.

4. The display driver according to claim 1, wherein said shift register has a first shift mode in which to shift an output start signal in said first to K-th flip-flops in order of the first flip-flop, the second flip-flop, the third flip-flop, . . . , the (K−1)-th flip-flop, and the K-th flip-flop, whereby timing to apply the pixel driving voltages to the data lines is delayed in order of the first output enable signal, the second output enable signal, the third output enable signal, . . . , the (K−1)-th output enable signal, and the K-th output enable signal, and a second shift mode in which to shift said output start signal in said first to K-th flip-flops in order of the K-th flip-flop, the (K−1)-th flip-flop, . . . , the third flip-flop, the second flip-flop, the first flip-flop, whereby the timing to apply the pixel driving voltages to the data lines is delayed in order of the K-th output enable signal, the (K−1)-th output enable signal, . . . , the third output enable signal, the second output enable signal, and the first output enable signal, the driver further comprising a delay mode setting part for setting which to make an operation in, said first shift mode or said second shift mode.

5. A display driver which drives a display device, comprising:

a first driver for applying first to K-th (K is n/2 and n is an integer greater than or equal to 2) pixel driving voltages among the first to an n-th pixel driving voltages corresponding to pixel-by-pixel luminance levels indicated by an image data signal to first to K-th data lines of the display device, respectively; and a second driver for applying a (K+1)-th to the n-th pixel driving voltages among said first to n-th pixel driving voltages to (K+1)-th to n-th data lines of the display device, respectively, wherein:

the first and second drivers each include a delayed clock generation part configured to generate first to t-th (t is an integer less than or equal to K and greater than or equal to 2) delayed clock signals having phases different from each other and being synchronized with a reference clock signal;

an output enable signal generation part configured to generate first to K-th output enable signals on the basis of said first to t-th delayed clock signals, wherein said output enable signal generation part includes a shift register including first to K-th flip-flops connected in series, wherein said first to K-th flip-flops are each supplied with any one of said first to t-th delayed clock signals, and wherein outputs of said first to K-th flip-flops serve as said first to K-th output enable signals respectively; and an output part configured to apply the K pixel driving voltages to the K data lines at respective different timings on the basis of said first to K-th output enable signals, wherein:

said delayed clock generation part includes a phase comparator and a variable delay circuit group constituted by first to (t+1)-th variable delay circuits each having a basic delay time which is one (t+1)-th of a period of said reference clock signal are connected in series with each other;

said reference clock signal is supplied to the first variable delay circuit;

outputs of the first to t-th variable delay circuits in said variable delay circuit group serve as said first to t-th delayed clock signals respectively; and said phase comparator adjusts a delay time of each of the first to t-th variable delay circuits in the variable delay circuit group on the basis of a phase difference between a signal output from the (t+1)-th variable delay circuit and said reference clock signal.

6. The display driver according to claim 5, wherein each of the first to t-th variable delay circuits is a variable delay element having an element delay of said basic delay time.

7. The display driver according to claim 6, wherein said shift register has a first shift mode in which to shift an output start signal in said first to K-th flip-flops in order of the first flip-flop, the second flip-flop, the third flip-flop, . . . , the (K−1)-th flip-flop, and the K-th flip-flop, whereby timing to apply the pixel driving voltages to the data lines is delayed in order of the first output enable signal, the second output enable signal, the third output enable signal, . . . , the (K−1)-th output enable signal, and the K-th output enable signal, and a second shift mode in which to shift said output start signal in said first to K-th flip-flops in order of the K-th flip-flop, the (K−1)-th flip-flop, . . . , the third flip-flop, the second flip-flop, the first flip-flop, whereby the timing to apply the pixel driving voltages to the data lines is delayed in order of the K-th output enable signal, the (K−1)-th output enable signal, . . . , the third output enable signal, the second output enable signal, and the first output enable signal, the driver further comprising a delay mode setting part for setting which to make an operation in, said first shift mode or said second shift mode.

8. The display driver according to claim 5, wherein said shift register has a first shift mode in which to shift an output start signal in said first to K-th flip-flops in order of the first flip-flop, the second flip-flop, the third flip-flop, . . . , the (K−1)-th flip-flop, and the K-th flip-flop, whereby timing to apply the pixel driving voltages to the data lines is delayed in order of the first output enable signal, the second output enable signal, the third output enable signal, . . . , the (K−1)-th output enable signal, and the K-th output enable signal, and a second shift mode in which to shift said output start signal in said first to K-th flip-flops in order of the K-th flip-flop, the (K−1)-th flip-flop, . . . , the third flip-flop, the second flip-flop, the first flip-flop, whereby the timing to apply the pixel driving voltages to the data lines is delayed in order of the K-th output enable signal, the (K−1)-th output enable signal, ..., the third output enable signal, the second output enable signal, and the first output enable signal, the driver further comprising a delay mode setting part for setting which to make an operation in, said first shift mode or said second shift mode.

\* \* \* \* \*